US010121827B1

(12) United States Patent
Lin et al.

(10) Patent No.: US 10,121,827 B1
(45) Date of Patent: Nov. 6, 2018

(54) SEMICONDUCTOR STRUCTURE AND THE METHOD OF MAKING THE SAME

(71) Applicant: UNITED MICROELECTRONICS CORP., Hsin-Chu (TW)

(72) Inventors: Chin-Fu Lin, Tainan (TW); Chung-Yi Chiu, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/813,173

(22) Filed: Nov. 15, 2017

(30) Foreign Application Priority Data

Oct. 18, 2017 (CN) .......................... 2017 1 0971308

(51) Int. Cl.
H01L 27/24 (2006.01)
H01L 45/00 (2006.01)
H01L 29/16 (2006.01)
H01L 29/24 (2006.01)
H01L 29/49 (2006.01)
H01L 29/786 (2006.01)

(52) U.S. Cl.
CPC ...... H01L 27/2436 (2013.01); H01L 45/1675 (2013.01); H01L 29/1606 (2013.01); H01L 29/24 (2013.01); H01L 29/4908 (2013.01); H01L 29/78684 (2013.01); H01L 45/06 (2013.01); H01L 45/1233 (2013.01); H01L 45/146 (2013.01); H01L 45/147 (2013.01)

(58) Field of Classification Search
CPC ............. H01L 27/2436; H01L 29/1606; H01L 29/4908; H01L 29/78684; H01L 45/1233; H01L 45/145–45/147
See application file for complete search history.

(56) References Cited

U.S. PATENT DOCUMENTS

| 8,766,233 | B2 * | 7/2014 | Sakotsubo | ........ H01L 21/02183 |
| | | | | 257/4 |
| 9,023,699 | B2 | 5/2015 | Chang | |
| 9,178,000 | B1 | 11/2015 | Nardi | |
| 9,887,352 | B2 * | 2/2018 | Bessonov | ........... H01L 45/1233 |
| 2016/0020280 | A1 * | 1/2016 | Heo | ........................ H01L 33/26 |
| | | | | 257/27 |
| 2017/0162654 | A1 * | 6/2017 | Maeda | .................... H01L 29/04 |

* cited by examiner

Primary Examiner — Allison Bernstein
(74) Attorney, Agent, or Firm — Winston Hsu

(57) ABSTRACT

The present invention provides a semiconductor structure, the semiconductor structure includes a substrate defining a memory region and a transistor region, an insulating layer is disposed on the substrate, a 2D material layer disposed on the insulating layer, and disposed within the memory and the transistor region, parts of the 2D material layer within the transistor region is used as the channel region of a transistor structure, the transistor structure is disposed on the channel region. And a resistive random access memory (RRAM) located in the memory region, the RRAM includes a lower electrode layer, a resistance transition layer and an upper electrode layer being sequentially located on the 2D material layer and electrically connected to the channel region.

20 Claims, 6 Drawing Sheets

SEMICONDUCTOR STRUCTURE AND THE METHOD OF MAKING THE SAME

BACKGROUND OF THE INVENTION

1. Field of the Invention

The present invention relates to a semiconductor structure, and more particularly, to a transistor including a 2D material layer and a resistive random access memory (hereinafter abbreviated as RRAM) structure and the manufacturing method thereof.

2. Description of the Prior Art

Resistive random access memory (RRAM) has a simple structure, low operating voltage, high-speed, good endurance, and CMOS process compatibility. RRAM is the most promising alternative to provide a downsized replacement for traditional flash memory. RRAM is finding wide application in devices such as optical disks and non-volatile memory arrays.

An RRAM cell stores data within a layer of material that can be induced to undergo a phase change. The phase change can be induced within all or part of the layer to switch between a high resistance state and a low resistance state. The resistance state can be queried and interpreted as representing either a "0" or a "1". In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again.

SUMMARY OF THE INVENTION

The present invention provides a semiconductor structure, the semiconductor structure includes a substrate, a memory region and a transistor region are defined thereon, an insulating layer disposed on the substrate, a 2D material layer located on the insulating layer and simultaneously located within the memory region and within the transistor region, wherein a portion of the 2D material layer within the transistor region is a channel region of a transistor, the transistor is disposed on the channel region within the transistor region, and a resistive random access memory (RRAM) located within the memory region, the RRAM comprises a lower electrode layer, a resistive switching layer and an upper electrode layer sequentially located on a portion of the 2D material layer in the memory region, and the RRAM is electrically connected to the channel region.

The present invention further provides a method for forming a semiconductor structure. Firstly, a substrate is provided, a memory region and a transistor region are defined thereon, next, an insulating layer is formed on the substrate, a 2D material layer is formed on the insulating layer and simultaneously located within the memory region and within the transistor region, wherein a portion of the 2D material layer within the transistor region is a channel region of a transistor, the transistor is disposed on the channel region within the transistor region, and a resistive random access memory (RRAM) is formed within the memory region, the RRAM comprises a lower electrode layer, a resistive switching layer and an upper electrode layer sequentially located on a portion of the 2D material layer in the memory region, and the RRAM is electrically connected to the channel region.

One feature of the present invention is that a 2D material layer is formed on the insulating layer, next, the RRAM and the transistor are formed on the 2D material layer respectively. Therefore, the 2D material layer may be used as a channel region of the transistor, and may also be electrically connected to the RRAM as a connection element for both devices. Besides, the 2D material layer has the advantages of high conduction speed and low energy consumption, it can improve the performance of the RRAM and the transistor simultaneously. In the present invention, some material layers can be simultaneously formed during the processes for forming the RRAM and the transistor. For example, the resistance switching layer of the RRAM and the high-k dielectric layer in the transistor are formed simultaneously by a same material layer, and the upper electrode of the RRAM and the barrier layer of the transistor are also made by one identical material layer, so that the process steps can be reduced to improve the efficiency of the process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
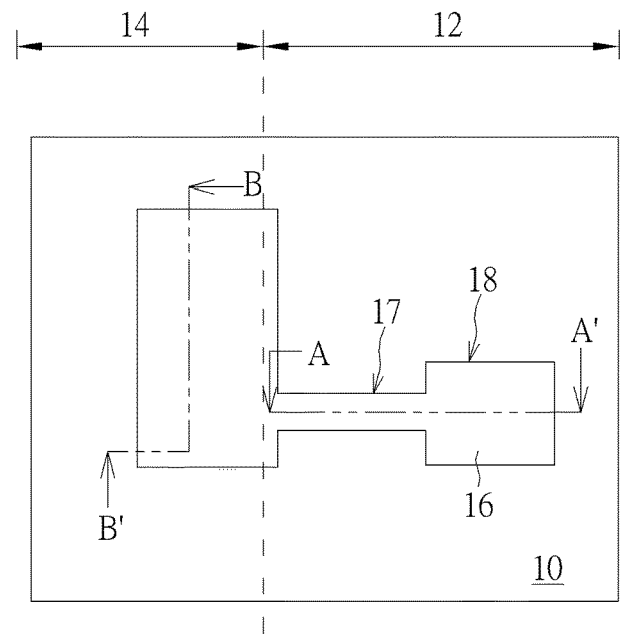
FIG. 1 illustrates a top view diagram of a semiconductor structure according to a preferred embodiment of the present invention.
Figure 2:
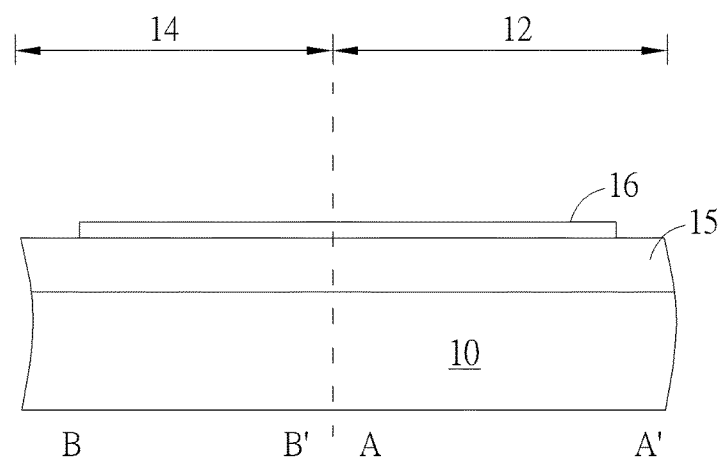
FIG. 2 is a schematic cross-section diagram along the cross-section line A-A' and the cross section line B-B' in FIG. 1.

Firstly, please refer to FIG. 1 and FIG. 2, FIG. 1 illustrates a top view diagram of a semiconductor structure according to a preferred embodiment of the present invention. FIG. 2 is a schematic cross-section diagram along the cross-section line A-A' and the cross section line B-B' in FIG. 1. As shown in FIG. 1, a substrate 10 is provided, such as a silicon substrate. A transistor region 12 and a memory region 14 that disposed adjacent to the transistor region 12 are defined on the substrate 10. In the following steps, a transistor is predicted to be formed in the transistor region 12, and a resistive random access memory (RRAM) is formed in the memory region 14. An insulating layer 15 and a patterned 2D material layer 16 are formed on the substrate 10. The 2D material layer 16 has thin thinness and extremely low resistance, such as a single layer or a multiple layers of graphene, phosphine ($PH_3$), molybdenum disulfide ($MoS_2$) or other transition metal disulfide. Since the 2D material layer 16 is preferably formed on the insulating layer, the insulating layer 15 (e.g., silicon oxide or silicon nitride, etc.) is formed on the substrate 10 before the 2D material layer 16 is formed.

In the present embodiment, the 2D material layer 16 is simultaneously located within the transistor region 12 and within the memory region 14, and the 2D material layers 16 located in the two regions are connected to each other. When viewed in a top view, the 2D material layer 16 has a structure similar to L shape, but is not limited thereto. In the following steps, the RRAM will be formed within the memory region 14 on the 2D material layer 16. Within the transistor region 12, the 2D material layer 16 includes a narrower portion 17 and a wider portion 18, the narrower portion 17 defines the channel region of the following-formed transistor. In other words, in the present embodiment, a portion of the 2D material layer 16 within the transistor region 12 will be used as a channel region of the following-formed transistor. In addition, the wider portion 18 of the 2D material layer 16 may be used to define the location of the source/drain regions of the transistor, to connect the following-formed contact structures or other elements, but not limited thereto.

Figure 3:
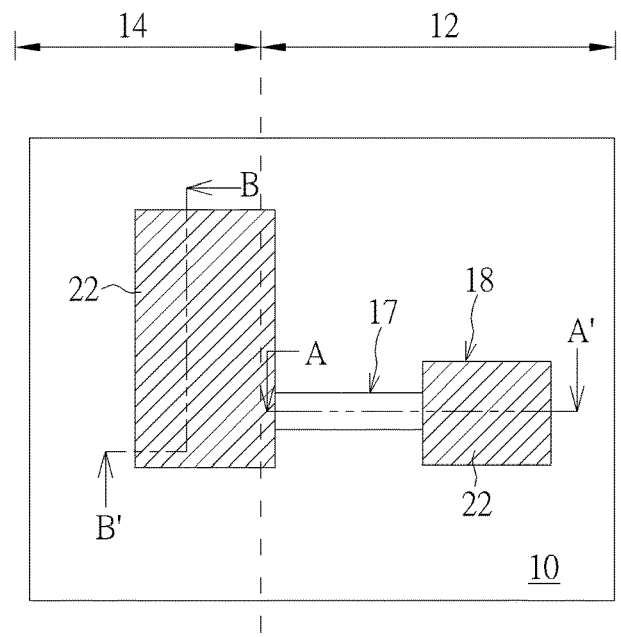
FIG. 3 shows the top view diagram of the semiconductor structure subsequent to FIG. 1.
Figure 4:
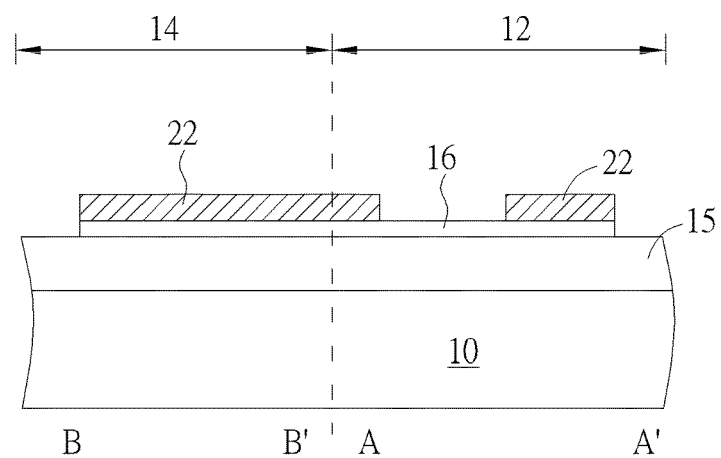
FIG. 4 is a schematic cross-section diagram along the cross-section line A-A' and the cross section line B-B' in FIG. 3.

Please refer to FIG. 3 and FIG. 4, FIG. 3 shows the top view diagram of the semiconductor structure subsequent to FIG. 1, FIG. 4 is a schematic cross-section diagram along the cross-section line A-A' and the cross section line B-B' in FIG. 3. As shown in FIG. 3, a patterned lower electrode layer 22 is formed, for example, a titanium layer, a titanium nitride layer or a tantalum nitride layer, but is not limited thereto. The patterned lower electrode layer 22 covers the 2D material layer 16 within the transistor region 12 and within the memory region 14 respectively, but does not cover the narrower portion 17 within the transistor region 12 (the position of the following formed channel region of the transistor). Therefore, when viewed in a cross section view (FIG. 4), the 2D material layer 16 is partially exposed. The patterned lower electrode layer 22 within the transistor region 12 is used as the source/drain regions respectively, and the patterned lower electrode layer 22 within the memory region 14 is directly connected to one of the patterned lower electrode layer 22 (in other words, one of the source region and the drain region).

Figure 5:
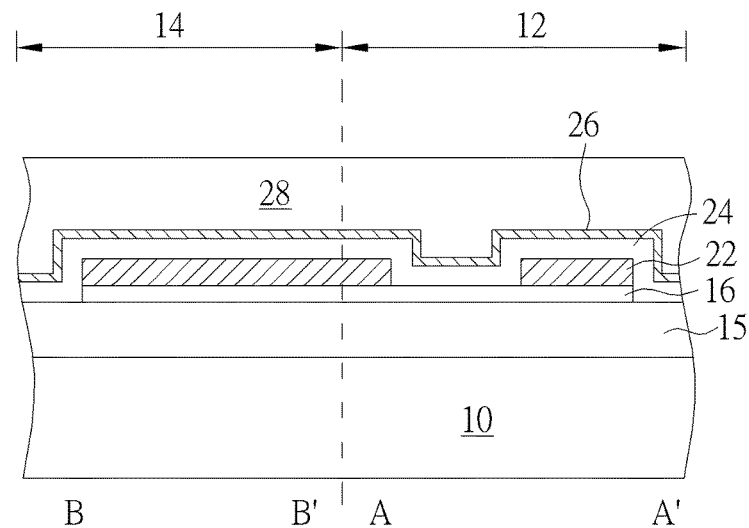
FIG. 5 shows the top view diagram of the semiconductor structure subsequent to FIG. 4.

FIG. 5 shows the top view diagram of the semiconductor structure subsequent to FIG. 4. Next, a high-k dielectric layer 24, an upper electrode layer 26 and a gate conductive layer 28 are sequentially formed, to entirely cover the transistor region 12 and the memory region 14. The high-k dielectric layer 24 comprises, for example, a dielectric material having a dielectric constant (k-value) greater than 4, such as hafnium oxide ($HfO_2$), hafnium silicon oxide (Hf-$SiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The material of the upper electrode layer 26 includes such as titanium, titanium nitride, and tantalum nitride. The material of the gate conductive layer 28 may include undoped polysilicon, heavily doped polysilicon, a monolayer or multilayer metal. The metal layers include such as work function metal layers, barrier layers and low resistance metal layers, but are not limited thereto. In addition, since the above-mentioned 2D material layer 16 located in the narrower region 17 is exposed, a portion of the high-k dielectric layer 24 directly contacts the 2D material layer 16.

Figure 6:
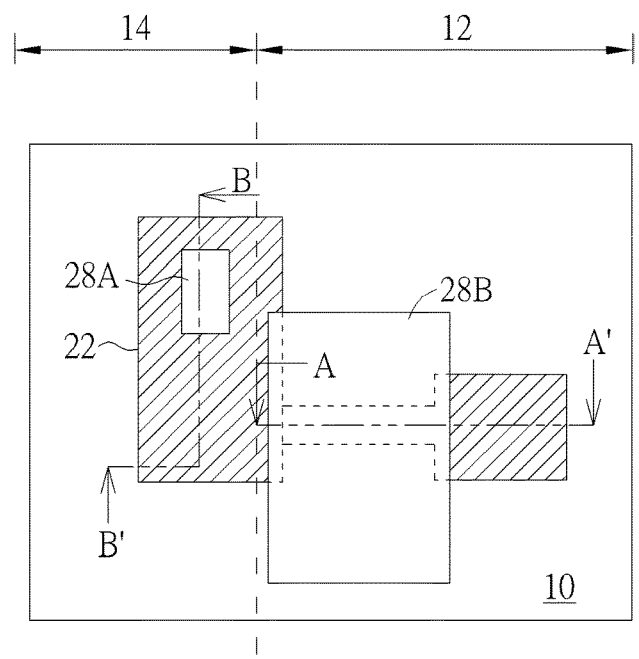
FIG. 6 shows the top view diagram of the semiconductor structure subsequent to FIG. 5.
Figure 7:
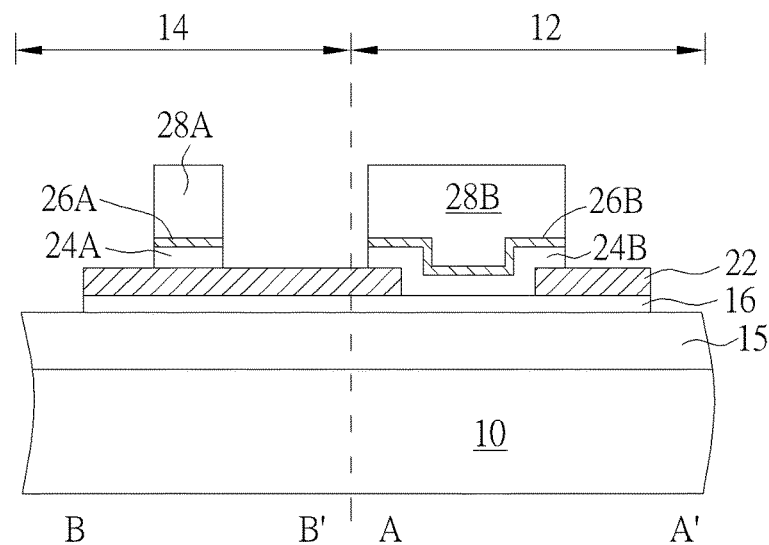
FIG. 7 is a schematic cross-section diagram along the cross-section line A-A' and the cross section line B-B' in FIG. 6.

Please refer to FIGS. 6-7, FIG. 6 shows the top view diagram of the semiconductor structure subsequent to FIG. 5. FIG. 7 is a schematic cross-section diagram along the cross-section line A-A' and the cross section line B-B' in FIG. 6. An etching step is performed, a portion of the gate conductive layer 28, a portion of the upper electrode layer 26 and a portion of the high dielectric constant layer 24 are removed. After the etching step is carried out, within the memory region 14, the remaining high-k dielectric layer 24 is defined as a resistance switching layer 24A, the remaining upper electrode layer 26 is defined as an upper electrode 26A, and the remaining gate conductive layer 28 is defined as a conductive layer 28A. On the other hand, within the transistor region 12, the remaining high-k dielectric layer 24 is defined as a high-k dielectric layer 24B, the remaining upper electrode layer 26 is defined as a barrier layer 26B, and the remaining gate conductive layer 28 is defined as a gate conductive layer 28B. The pattern of the high-k dielectric layer 24B within the transistor region 12 is the same as the pattern of the barrier layer 26B, and the high-k dielectric layer 24B partially crosses the lower electrode layer 22 (the source/drain region). It is to be noted that some material layer are fabricated by one identical process. For example, the material and the thickness of the resistive switching layer 24A are same as the material and the thickness of the high-k dielectric layer 24B, the material and the thickness of the upper electrode 26A are same as the material and the thickness of the barrier layer 26B, the material and the thickness of the conductive layer 28A are same as the material and the thickness of the gate conductive layer 28B.

Figure 8:
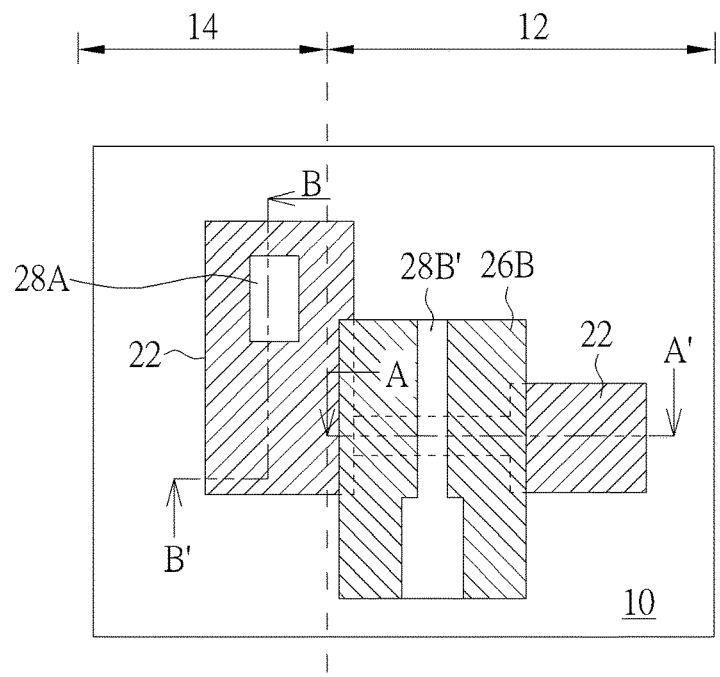
FIG. 8 shows the top view diagram of the semiconductor structure subsequent to FIG. 6.
Figure 9:
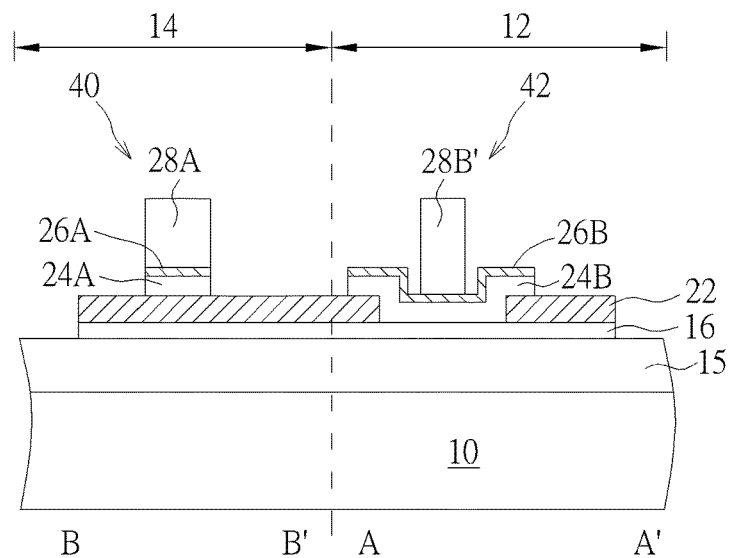
FIG. 9 is a schematic cross-section diagram along the cross-section line A-A' and the cross section line B-B' in FIG. 8.

FIG. 8 shows the top view diagram of the semiconductor structure subsequent to FIG. 6. FIG. 9 is a schematic cross-section diagram along the cross-section line A-A' and the cross section line B-B' in FIG. 8. As shown in FIG. 8 and FIG. 9, a mask layer (not shown) is formed in the memory region 14, and another etching step is performed to remove a portion of the gate conductive layer 28B, and to form a gate conductive Layer 28B'. Afterwards, the mask layer is then removed. Preferably, the extending direction of the gate conductive layer 28B' is perpendicular to the extending direction of the narrow portion 17 of the 2D material layer 16. For example, as shown in FIG. 8, the gate conductive layer 28B' extends along the vertical direction, and the narrower portion 17 of the 2D material layer 16 extends along the horizontal direction (please also refer to FIG. 1). The gate conductive layer 28B' will be used as the gate of the following formed transistor. In addition, since the gate conductive layer 28B is partially removed in this step, the area of the gate conductive layer 28B' will be smaller than the area of the barrier layer 26B from the top view of FIG. 8. In other words, the barrier layer 26B is partially exposed. It is to be noted that since the upper electrode 26A and the barrier layer 26B are formed by a same process and are formed by the same material layer, the material of the upper electrode 26A is same as the material of the barrier layer 26B, and the top surfaces of the upper electrode 26A and the top surface of the barrier layer 26B are on a same level. Similarly, the material of the conductive layer 28A is same as the material of the gate conductive layer 28B', and the top surfaces of the conductive layer 28A and the top surface of the gate conductive layer 28B' are on a same level. In the step shown in FIG. 9, a resistive random access memory (RRAM) 40 located in the memory area 14 and a transistor 42 located within the transistor region 12 have been completed. The RRAM 40 includes at least a patterned lower electrode layer 22, a resistance switching layer 24A and an upper electrode 26A. The transistor 42 includes at least a channel portion formed by the 2D material layer 16, a source region and a drain region formed by the patterned lower electrode layers 22, and gate formed by the high-k dielectric layer 24B, the barrier layer 26B and the gate material layer 28B'.

In addition, from the steps shown in FIGS. 6-9, the etching process is performed twice to form the gate conductive layer 28', and the process for forming the gate conductive layer 28' can be simplified. In other words, since the gate conductive layer 28' has a precise pattern, a roughly pattern (e.g., FIG. 6) is formed by one etching, and a precise gate conductive layer 28' is then formed by another etching (FIG. 8). However, the present invention also includes forming the conductive layer 28A and the gate conductive layer 28' directly through only one etching step.

Figure 10:
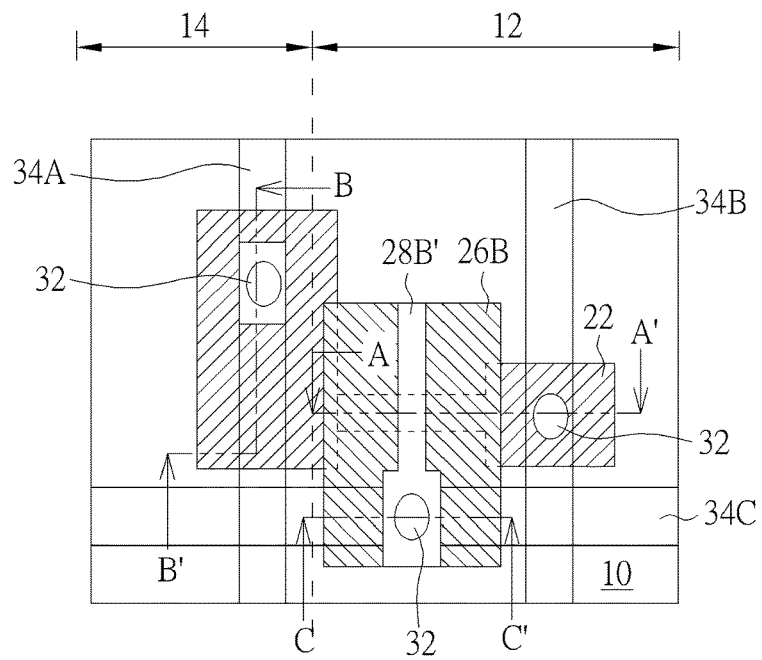
FIG. 10 shows the top view diagram of the semiconductor structure subsequent to FIG. 8.
Figure 11:
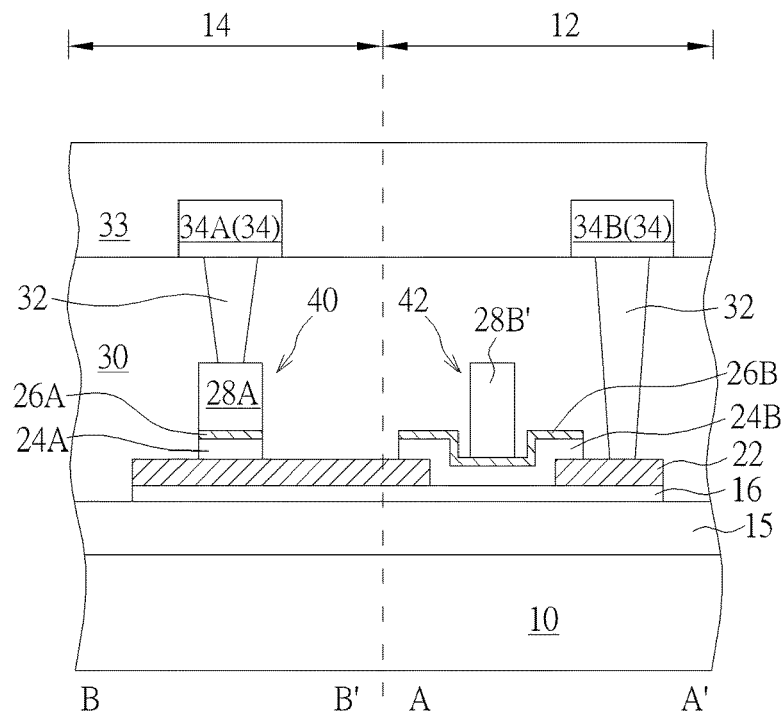
FIG. 11 is a schematic cross-section diagram along the cross-section line A-A' and the cross section line B-B' in FIG. 10.
Figure 12:
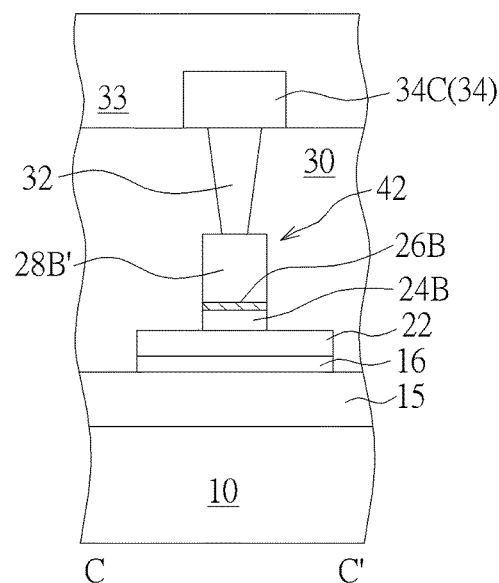
FIG. 12 is a schematic cross-section diagram along the cross-section line C-C' in FIG. 10.

Finally, please refer to FIG. 10 to FIG. 12. FIG. 10 shows the top view diagram of the semiconductor structure subsequent to FIG. 8. FIG. 11 is a schematic cross-section diagram along the cross-section line A-A' and the cross section line B-B' in FIG. 10. FIG. 12 is a schematic cross-section diagram along the cross-section line C-C' in FIG. 10. A dielectric layer 30 is formed to cover the transistor region 12 and the memory region 14, and a plurality of contact structures 32 are formed to electrically connect the conductive layer 28A, the gate conductive layer 28B, and the portion of the lower electrode layer 22 located in the transistor region (i.e., the source/drain region of the transistor). Next, a second dielectric layer 33 is formed to cover the dielectric layer 30, and a plurality of traces 34 are formed to electrically connect the above-mentioned contact structures 32, which may include word lines, bit lines or selection lines. More specifically, a selection line 34A is electrically connected to the RRAM 40 shown in FIG. 11; a bit line 34B is electrically connected to the source region or the drain region of the transistor 42 shown in FIG. 11; and a word line 34C is electrically connected to the gate of the transistor 42 shown in FIG. 12.

One feature of the present invention is that a 2D material layer 16 is formed on the insulating layer 15, next, the RRAM 40 and the transistor 42 are formed on the 2D material layer 16 respectively. Therefore, the 2D material layer 16 may be used as a channel region of the transistor, and may also be electrically connected to the RRAM 40 as a connection element for both devices. Besides, the 2D material layer has the advantages of high conduction speed and low energy consumption, it can improve the performance of the RRAM and the transistor simultaneously. In the present invention, some material layers can be simultaneously formed during the processes for forming the RRAM and the transistor. For example, the resistance switching layer of the RRAM and the high-k dielectric layer in the transistor are formed simultaneously by a same material layer, and the upper electrode of the RRAM and the barrier layer of the transistor are also made by another material layer simultaneously, so that the process steps can be reduced to improve the efficiency of the process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate, a memory region and a transistor region are defined thereon;
an insulating layer disposed on the substrate;
a 2D material layer located on the insulating layer, and simultaneously located within the memory region and within the transistor region, wherein a portion of the 2D material layer within the transistor region is a channel region of a transistor, the transistor is disposed on the channel region within the transistor region; and
a resistive random access memory (RRAM) located within the memory region, the RRAM comprises a lower electrode layer, a resistive switching layer and an upper electrode layer sequentially located on a portion of the 2D material layer in the memory region, wherein the lower electrode layer contacts the 2D material layer directly, and the RRAM is electrically connected to the channel region.

2. The semiconductor structure of claim 1, wherein the lower electrode layer is also located on a portion of the 2D material layer within the transistor region, and used as a source region and a drain of the transistor.

3. The semiconductor structure of claim 2, further comprising a patterned dielectric layer disposed on the lower electrode layer within the transistor region.

4. The semiconductor structure of claim 3, wherein the upper electrode layer is also located on the patterned dielectric layer within the transistor region, used as a gate of the transistor.

5. The semiconductor structure of claim 4, wherein the transistor comprises the source region, the drain region, the patterned dielectric layer and the gate.

6. The semiconductor structure of claim 3, wherein a portion of the patterned dielectric layer directly contacts the 2D material layer within the transistor region.

7. The semiconductor structure of claim 3, wherein the material of the patterned dielectric layer is the same as the material of the resistance switching layer.

8. The semiconductor structure of claim 1, wherein the upper electrode layer is located within the memory region and within the transistor region simultaneously, and a top surface of the upper electrode layer within the memory region is aligned with a top surface of the upper electrode layer within the transistor region.

9. The semiconductor structure of claim 8, further comprising a conductive layer, disposed on the upper electrode layer within the transistor region and within the memory region, and a top surface of the conductive layer within the memory region is aligned with a top surface of the conductive layer within the transistor region.

10. The semiconductor structure of claim 1, wherein the 2D material layer comprises graphene, phosphine or molybdenum disulfide ($MoS_2$).

11. A method for forming a semiconductor structure, comprising:

providing a substrate, a memory region and a transistor region are defined thereon;

forming an insulating layer on the substrate;

forming a 2D material layer located on the insulating layer and simultaneously located within the memory region and within the transistor region, wherein a portion of the 2D material layer within the transistor region is a channel region of a transistor, the transistor is disposed on the channel region within the transistor region; and forming a resistive random access memory (RRAM) within the memory region, the RRAM comprises a lower electrode layer, a resistive switching layer and an upper electrode layer sequentially located on a portion of the 2D material layer in the memory region, wherein the lower electrode layer contacts the 2D material layer directly, and the RRAM is electrically connected to the channel region.

12. The method of claim 11, wherein the lower electrode layer is also located on a portion of the 2D material layer within the transistor region, and used as a source region and a drain of the transistor.

13. The method of claim 12, further comprising a patterned dielectric layer disposed on the lower electrode layer within the transistor region.

14. The method of claim 13, wherein the upper electrode layer is also located on the patterned dielectric layer within the transistor region, used as a gate of the transistor.

15. The method of claim 14, wherein the transistor comprises the source region, the drain region, the patterned dielectric layer and the gate.

16. The method of claim 13, wherein a portion of the patterned dielectric layer directly contacts the 2D material layer within the transistor region.

17. The method of claim 13, wherein the material of the patterned dielectric layer is the same as the material of the resistance switching layer.

18. The method of claim 11, wherein the upper electrode layer is located within the memory region and within the transistor region simultaneously, and a top surface of the upper electrode layer within the memory region is aligned with a top surface of the upper electrode layer within the transistor region.

19. The method of claim 18, further comprising a conductive layer, disposed on the upper electrode layer within the transistor region and within the memory region, and a top surface of the conductive layer within the memory region is aligned with a top surface of the conductive layer within the transistor region.

20. The method of claim 11, wherein the 2D material layer comprises graphene, phosphine or molybdenum disulfide ($MoS_2$).

* * * * *